(12) United States Patent
Gemmeke et al.

(10) Patent No.: US 7,795,914 B2
(45) Date of Patent: Sep. 14, 2010

(54) CIRCUIT DESIGN METHODOLOGY TO REDUCE LEAKAGE POWER

(75) Inventors: Tobias Gemmeke, Stutensee (DE); Friedrich Schroeder, Stuttgart (DE); Stefan Bonsels, Stuttgart (DE); Dieter Wendel, Schoenaich (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/262,255

(22) Filed: Oct. 31, 2008

(65) Prior Publication Data

US 2009/0115504 A1    May 7, 2009

(51) Int. Cl.
*H03K 19/00* (2006.01)
*H03K 19/02* (2006.01)

(52) U.S. Cl. ................... 326/58; 326/27; 326/104

(58) Field of Classification Search .............. 326/56–60
See application file for complete search history.

(56) References Cited

U.S. PATENT DOCUMENTS

| | | | |
|---|---|---|---|
| 4,680,491 A * | 7/1987 | Yokouchi et al. ............ | 326/86 |
| 6,060,906 A * | 5/2000 | Chow et al. ................ | 326/81 |
| 6,515,516 B2 * | 2/2003 | Morgan ................... | 326/86 |
| 7,233,197 B2 | 6/2007 | Marshall et al. | |

\* cited by examiner

*Primary Examiner*—Rexford N Barnie
*Assistant Examiner*—Jany Tran
(74) *Attorney, Agent, or Firm*—Joseph P. Abate; Howard Cohn

(57) ABSTRACT

A three stage circuit according to the invention comprises a data input, a data output, a control input, two voltage supply inputs. The first stage is electrically connected to the data input and control input and is defined by a combinatorial circuitry with two outputs. The second stage is defined by at least two transistors connected in series between the two voltage supply inputs with their inputs electrically connected to the respective outputs of the first stage and with a common output such that in connection with the first stage they operate as a tri-state gate. The third stage of that three stage circuit is electrically connected to the control input and the common output of the second stage. The three stage circuit is switched to a low leakage state by a control signal feed via the control input and setting the two transistors in their off state resulting in a second stage with a floating common output filtered by the third stage via the control signal actively driven the data output to a specific logic value.

4 Claims, 7 Drawing Sheets

US 7,795,914 B2

CIRCUIT DESIGN METHODOLOGY TO REDUCE LEAKAGE POWER

This Counterpart Application claims priority to the German Application, Serial Number 07119899.8, filed on Nov. 2, 2007. The German Application has been abandoned.

DESCRIPTION

1. Technical Field

The present invention relates to a three stage circuit which can be switch to a low leakage state. Furthermore, it is related to a processor comprising a plurality of such three stage circuits. It is also related to a method for switching a three stage circuit to a low leakage state.

2. Background of the Invention

Large scale integrated circuit chips such as microprocessors use circuits such as sequential logic circuits to implement many different types of logic functions. It is becoming ever more important to save power in chips, for example, with mobile applications or in other relatively low power environments. Unfortunately, as integrated circuits become larger and greater performance demands are placed on the chips, it is becoming even more difficult to reduce power consumption.

Semiconductor processes are continually evolving to meet demands for increased performance, reduced cost and reduced power consumption. Currently the mainstream technology for meeting these needs is silicon CMOS technology. CMOS is a particular form of MOS technology in which two types of transistors are used—NMOS and PMOS—hence the name Complementary MOS. There are also NMOS and PMOS forms of MOS technology, which use exclusively NMOS and PMOS transistors respectively. PMOS devices transmit positive current when the signal on the gate is low, and cease transmitting positive current when the signal on the gate is high. NMOS devices transmit positive current when the signal on the gate is high, and cease transmitting positive current when the signal on the gate is low.

The feature size of CMOS circuits is being steadily reduced as manufacturers strive to be competitive on performance, cost and power consumption. The smaller the feature size ("geometry") of a process, the lower the voltage at which circuits designed in the process can operate without having failures due to voltage breakdown. MOS technology is based on the use of MOS transistors having a channel between two terminals called the source and the drain. The current that flows between the source and drain can be controlled by changing the voltage on a third terminal, called the gate. For a given voltage between the source and the drain, the current that flows between the source and drain is a complex function of the voltage on the gate.

In a digital circuit, the typical operating points of interest are the transistor being fully on or fully off, controlled by the gate voltage being either the minimum (Gnd) or the maximum ($V_{dd}$) voltage in the circuit. For an NMOS transistor, the fully on state corresponds to the gate being coupled to the most positive voltage in the circuit ($V_{dd}$), and the fully off state to the gate being coupled to the most negative voltage in the circuit (Gnd). PMOS transistors have a complementary behaviour to NMOS transistors—they are fully on when their gates are coupled to the most negative voltage in the circuit (Gnd), and fully off when their gates are coupled to the most positive voltage in the circuit ($V_{dd}$).

Some digital circuit components, such as pass transistors, can degrade the $V_{dd}$ and Gnd voltages discussed above. These degraded voltages are, however, still sufficient to generate the on and off states discussed above. Thus either a fill or degraded $V_{dd}$ signal can serve as a logical high, and either a full or degraded Gnd signal can serve as a logical low signal for the digital circuit.

"Coupling" as used herein may be either a direct coupling between the two enumerated elements, or an indirect coupling through other elements between the enumerated elements. For example, the gate of the PMOS transistor discussed above may be directly coupled to $V_{dd}$, or the gate of the PMOS transistor may be indirectly coupled to $V_{dd}$ through another PMOS transistor, or some other element.

Since the subthreshold region has an exponential dependence of the drain-source current, on the voltage difference between gate and source, $V_{gs}$, the current drops dramatically as $V_{gs}$ falls below the threshold level. When analysing the behaviour of digital circuits it is therefore common to regard an off transistor as carrying no current, and an on transistor as capable of carrying a high current. This is however an approximation, and in modern CMOS processes the validity of this approximation is under threat.

As CMOS technology moves to smaller and smaller geometries, the operating voltage of CMOS circuits is being steadily reduced to stay within the operating voltage limits of the smaller geometry processes. As the operating voltage reduces, so does the maximum voltage ($V_{dd}$) that can be coupled to the gate of an NMOS transistor in the circuit, and therefore the current that can be carried by a fully on transistor is reduced. The operating speed of a CMOS circuit is typically determined by the rate at which charge can be moved on and off the parasitic capacitances in the circuit via the on transistors, so any reduction in the ability of the transistors to conduct current will lead to an increase in the time required to move this charge, and therefore to a reduction in the operating speed of the circuit. Thus as the operating voltage limits on transistors become smaller, the transistors become slower. It is possible to correct for this effect by reducing the threshold voltage of the transistors—the lower the threshold voltage, the higher the current that can be carried by a fully on transistor.

However, there is another effect to consider that restricts the CMOS process developer's freedom to reduce the threshold voltage. If the threshold voltage is reduced, the subthreshold region is correspondingly reduced. Therefore, an off transistor is not so far into the subthreshold region, and so the current through an off transistor (commonly referred to as the leakage current) will be increased. Because of the exponential dependence of subthreshold current on gate voltage, a small reduction in threshold voltage can lead to a large increase in leakage current.

For process geometries of about 0.13 μm and below it is no longer possible to find a single choice of threshold voltage that is suitable for both high speed and low leakage circuit operation. Instead, such processes commonly offer the circuit designer a choice of two or more types of NMOS (and PMOS) transistors, with different threshold voltages. The highest threshold voltage transistor will have the lowest leakage current when turned fully off, and will conduct the smallest current when turned fully on. The current conducted when the transistor is turned fully on will limit the performance of many circuits. The lowest threshold voltage transistor will have the highest leakage current when turned fully off, and will conduct the largest current when turned fully on. The current conducted when the transistor is turned fully on will provide the highest performance circuits. However, the high leakage current (which may be thousands of times higher than the leakage current of a highest threshold transistor of the same size) will often mean that these low threshold voltage value, transistors can only be used in portions of circuits that are time-critical, or where power dissipation is not a concern for some other reason.

Typically the designer's concern for the level of leakage current is not related to ensuring correct circuit operation, but is related to minimising power dissipation. For portable electronic devices this equates to maximising battery life. For example, mobile phones need to be powered for extended periods (known as standby mode, during which the phone is able to receive an incoming call), but are fully active for much shorter periods (known as talk or active mode, while making a call). When an electronic device such as a mobile phone is in standby mode, certain portions of the circuitry within the electronic device, which are active when the phone is in talk mode, are shut down. These circuits, however, still have leakage currents running through them, even though they have been de-activated. Even if the leakage current is much smaller than the normal operating current of the circuit, the leakage current depletes the battery charge over the relatively long standby time, whereas the operating current during talk time only depletes the battery charge over the relatively short talk time. As a result, the leakage current has a disproportional effect on total battery life, making leakage current an important design constraint.

In U.S. Pat. No. 7,233,197 is disclosed a method to avoid leakage currents across circuit components such as transistors by placing circuits into a low-leakage standby mode. The circuits are configured such that voltage differentials across leakage-prone circuit components are avoided when in standby mode. Such a reconfigurable circuit is adapted to be switched to a low leakage state by providing a signal on the data input that causes the circuit to enter the low leakage state.

SUMMARY OF THE INVENTION

In view of the above, it is an object of the present invention to provide a circuit design methodology allowing reducing leakage power when switching at least portion of a processor comprising such circuits to a low power regime independently from any data input.

This object is achieved in accordance with the invention by implementing a three stage circuit comprising a data input, a data output, a control input, two voltage supply inputs with as respective level Vdd and Ground. The first stage of that three stage circuit is electrically connected to the data input and control input and is defined by a combinatorial circuitry with two outputs. The second stage of that three stage circuit is defined by at least two transistors connected in series between the two voltage supply inputs with their inputs electrically connected to the respective outputs of the first stage and with a common output such that in connection with the first stage they operate as a tri-state gate. The third stage of that three stage circuit is electrically connected to the control input and the common output of the second stage. The third stage is defined by some filtering property acting on the signal at the common output of the second stage. According to the invention, the three stage circuit is switched to a low leakage state by a control signal feed via the control input and setting the two transistors in their off state resulting in a second stage with a floating common output filtered by the third stage via the control signal actively driven the data output to a specific logic value.

According to an embodiment of the invention, the third stage is defined by a fence with two inputs electrically connected respectively to the control input and the common output from the second stage. The third stage comprises also a logical gate to drive the data output to a specific logic value being possibly high or low depending on that logical gate.

According to another embodiment, the three stage circuit comprises a successive number of tri-state gates made out of a first stage, the control stage, and a second stage, the output stage, all electrically interconnected between each other.

In a further embodiment according to the invention, a processor comprises a plurality of such kind of three stage circuits.

The invention further relates to a method for switching such kind of three stage circuit to a low leakage state. The method comprises the step to provide a control signal at the control input setting the two transistors in their off state. Then, it results that the second stage shows a floating common output. Such floating common output must be filtered by the third stage via the control signal actively driven the data output to a specific logic value possibly high or low.

Advantageous developments of the invention are described in the dependent claims, the following description and the drawings.

DESCRIPTION OF THE DRAWINGS

An exemplary embodiment of the invention will now be explained further with the reference to the attached drawings in which.

DETAILED DESCRIPTION OF PREFERRED EMBODIMENTS

By default, Boolean logic has two legal values '0' and '1'. These values are represented in a physical circuit representation by voltage levels. In case of positive logic, the values '0' and '1' correspond to a low and high voltage, respectively. Typically, these levels are held by a low ohmic path to either supply node, i.e. Ground for '0' and Vdd for '1'. If there is no low ohmic path to a node, the node is floating. In this case, the node can drift to any voltage. This state has found its logical equivalent called 'Z' value signifying an unknown logic value—a third state. If a physical gate does not actively drive its outputs, i.e. there is no low ohmic path to any of the two supply nodes it is then tri-stated. Such behaviour can be obtained in several ways.

Figure 1A:
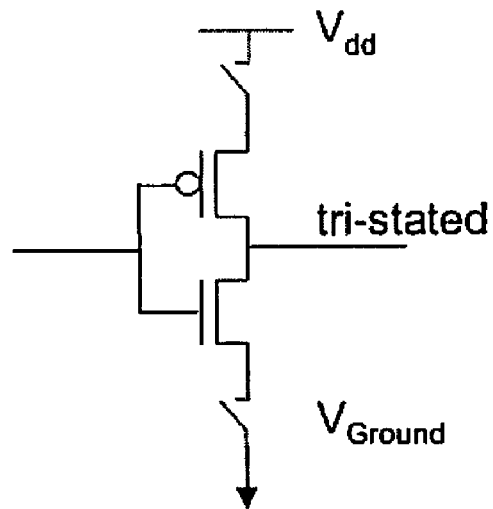
FIGS. 1a and 1b are schematic views of a gate powered in two different states.
Figure 1B:
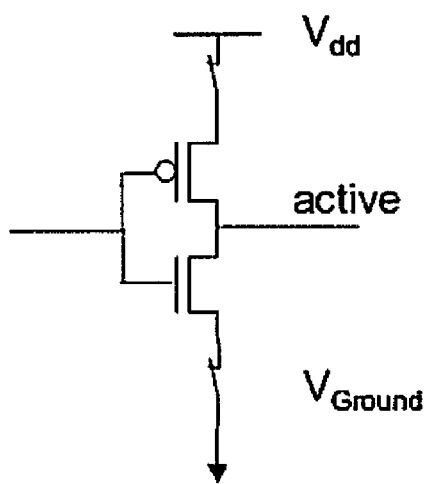
Figure 2A:
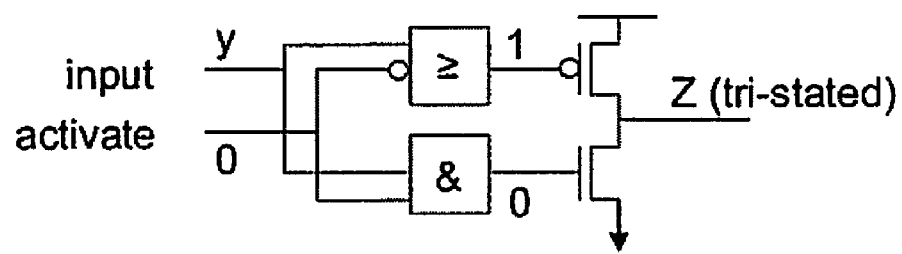
FIGS. 2a and 2b are schematic views of a tri-state buffer switched in two different states.
Figure 2B:
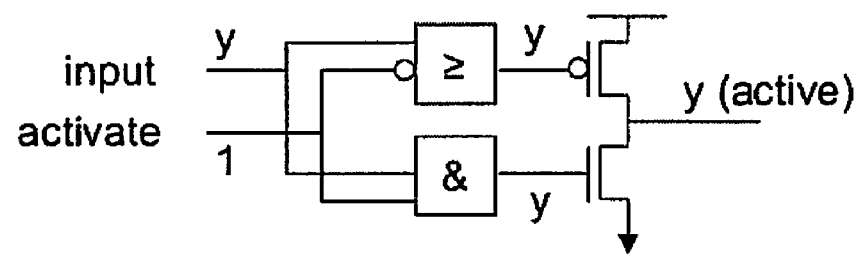

On FIG. 1a is shown a gate made out of a combination in series of a PMOS kind and a NMOS kind junction or transistor. Such typical CMOS gate is tri-stated using power gating. The two voltage supplies inputs Vdd and Ground are switched off. FIG. 1b shows the same gate in an active state. FIG. 2a shows a similar CMOS gate this time tri-stated using some control stage made out of combinatorial circuitry (AND-gate, OR-gate). The control stage controls both junctions such that when tri-stated (FIG. 2a) the gate shows a floating node with the value 'Z' at its output. This is obtained by switching off at least one junction or transistor of each series connection between any supply node and the output node. In the case the control stage drives the gate to its active state (FIG. 2b) then the gate shows at its output the logic input value y which is either '0' or '1'.

Figure 3:
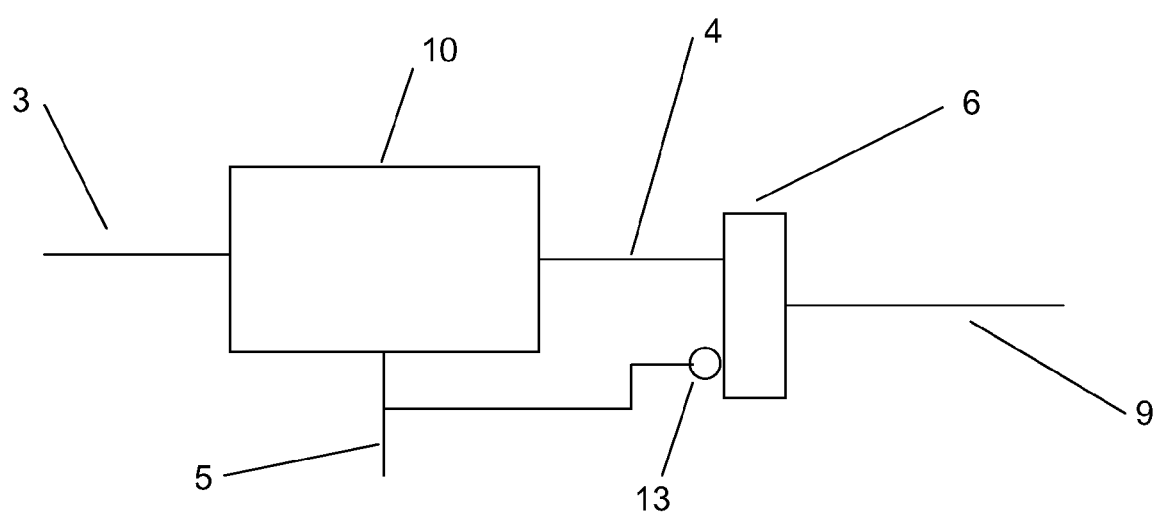
FIG. 3 discloses a schematic view of a three stage circuit according to the invention.
Figure 4:
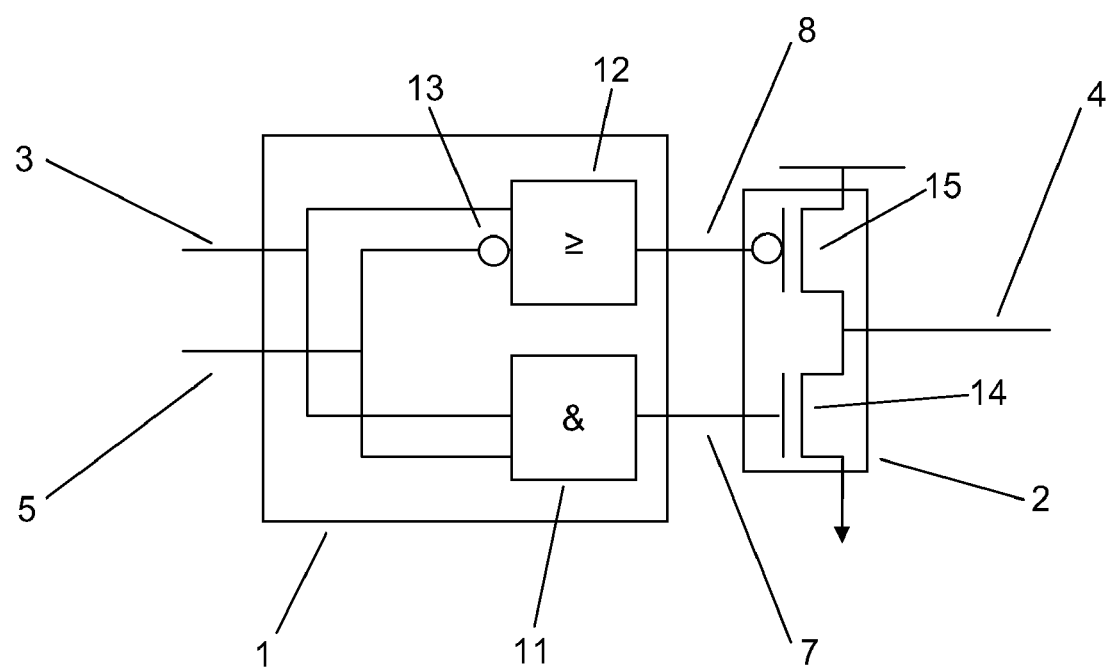
FIG. 4 shows a specific tri state gate.

On FIG. 3 is shown a three stage circuit according to the invention. It comprises an input 3 and an output 9 for the signals to be treated. Furthermore, the circuit comprises a tri-state gate 10 connected to the input 3 and to an output 4 for the tri-state signal as well as a control input 5 for the activation signal. To the output of the tri-state gate 10 is electrically connected a fence 6 also directly connected to the control input 5 via an inverter 13. And the output 9 of the three stage circuit corresponds to the output of the fence 6. On FIG. 4 is shown an example of a tri-state gate 10 which is made of a control stage 1 and an output stage 2. In the example shown on FIG. 4, the control stage 1 comprises two logical gates, namely an AND-gate 11 and an OR-gate 12 respectively for the NMOS and PMOS transistors 14 and 15 of the output stage 2. Both logical gates 11 and 12 are directly connected to the data input 3 and to the control input 5 while for the OR-gate an inverter 13 is placed in between the control input 5.

According to the invention, a control signal transmitted to the control stage 1 via the control input 5 drives the two transistors 14 and 15 in their off state i.e. low leakage state. This is obtained by the resulting control signal low and high respectively forwarded from the AND-gate 11 via the electrical path 7 to the NMOS junction and from the OR-gate 12 via the electrical path 8 to the PMOS junction. The change to a low leakage state using a control signal according to the invention can be done either dynamically i.e. at run time or statically i.e. at least parts of the processor are stopped. And the dedicated control block forces the appropriate state of the logic under consideration. There are various control scheme that could be applied, as e.g. a static control bit to set the state, a derivative of the clock activation signal that controls the registers before and/or after the logic under consideration, or a complex function of the two aforementioned plus some trigger input and/or counters tracing the number of (non) active cycles.

The resulting second stage 2 shows then a floating common output 4 (floating node indicated by a Z in logic simulation) i.e. is electrically disconnected from a power source. There is no active path between signal node and any supply node. And this floating output has to be filtered out to a specific value to prevent any Z to further propagate and possibly causing short circuit power. This is possibly but not exclusively obtained by the use of a physical fence 6 (see FIG. 3) as a third stage driven via the inverter 13 by the control signal forwarded from the control input 5 as shown on FIG. 3.

Figure 5A:
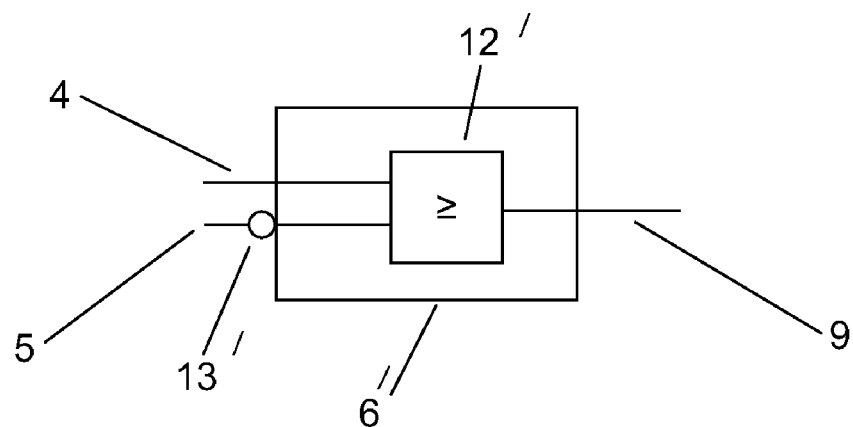
FIGS. 5a and 5b are schematic views of a fence to be used as the third stage of the three stage circuit.
Figure 5B:
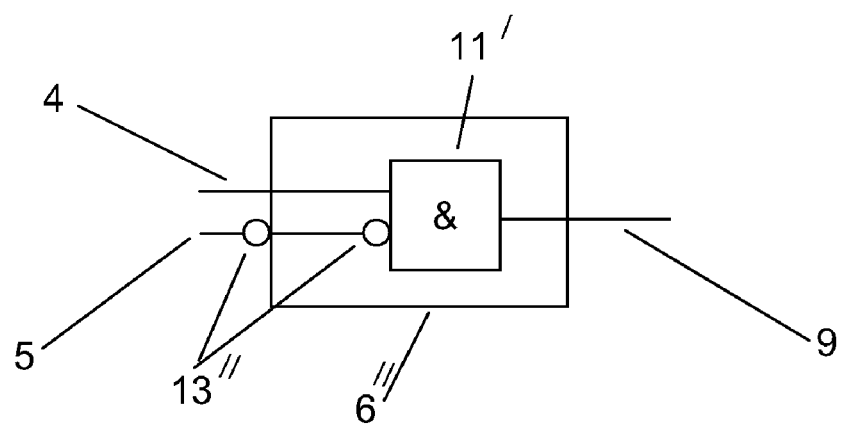

FIG. 5a and 5b show two examples of possible physical fences respectively 6' and 6". On FIG. 5a is shown a fence 6' comprising an OR-gate 12' and with an inverter 13' in between the control input 5. On FIG. 5b is shown a fence 6" comprising an AND-gate 11' this time with two inverters 13" in between the control input 5. Both fences 6' and 6" allow filtering the floating common output 4 via the control signal actively driven the data output 9 to a specific logic value. That logical value depends directly of the value of the control signal. Alternately, the fence can be realized virtually i.e. implicit to the existing logic e.g. by controlling a clock activation appropriately. Such implicit realization can be obtained by the use of a latch input that goes to a transmission that is not activated if its input can be tri-stated. Another implicit realization can be in form of the control stage of a tri-state gate. The data input to the control logic is ignored (equivalent to fencing the input) when the circuit is deactivated by active being set to 0. Hence, when using such control stages within a circuitry under consideration no explicit fences are required. Only outputs of this circuitry need to be additionally fenced. Depending on the logic on those outputs, virtual fencing can again be applied.

Figure 6:
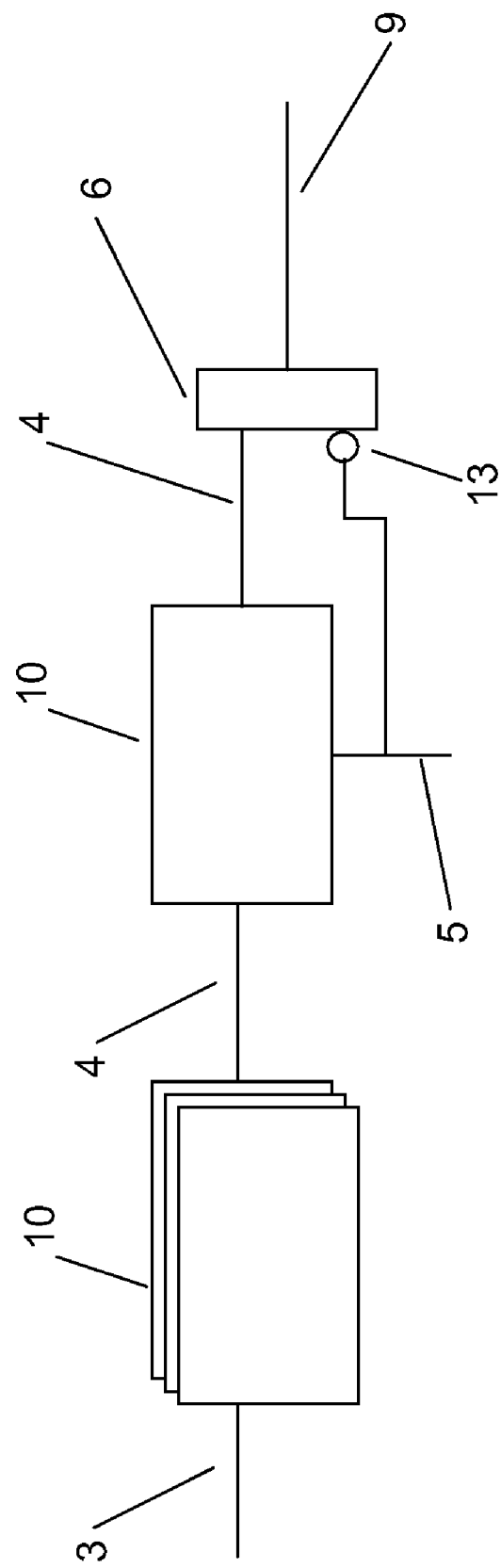
FIG. 6 shows a schematic view of a generalization comprising a plurality of three stages according to the invention.

The tri-state principle can be extended to any kind of CMOS gate. The inputs to that gate only need to be stimulated in such a way that at least two transistors are off in any path between the two supply levels. On FIG. 6 is shown an implementation according to the invention with a series of tri-state gate 10. The output of that series 10 feeds the resulting tri-state signal 4 to the electrically connected three stage circuit as shown on FIG. 3. The logic driving the output stage can be of any kind and complexity. However, the benefit of this approach relies on a reasonable amount of transistors (or more specific transistor width) being part of the gates in low-leakage state.

Any tri-state gate consists of at least two stages: a control stage and an output stage. The purpose of the present invention is to reduce leakage in the output stage. In principle, any kind of logic can be mapped onto any of the two gates. The control stage has to ensure in low leakage state that there is no low ohmic path between the output node(s) and any of the two supply nodes. The leakage of the control stage is tri-stated i.e. leakage in the control stage is not impacted. For this purpose, at least two explicit signals are required driving individual transistors in the NMOS and PMOS trees, respectively.

Figure 7:
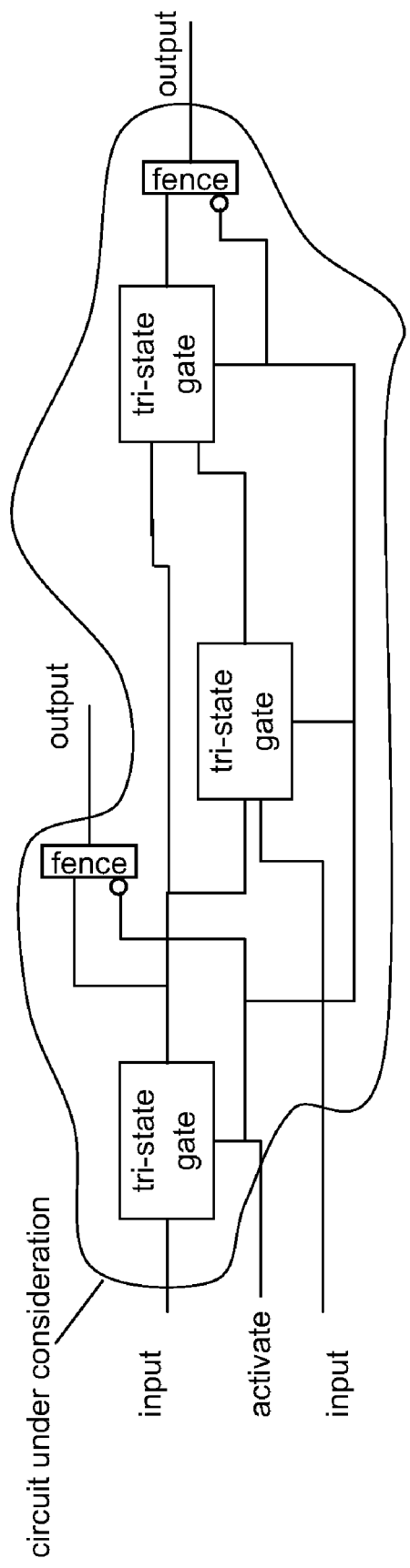
FIG. 7 is an alternative according to FIG. 6.

On FIG. 7 is shown a more general implementation of the present inventions comprising a plurality of tri-stated gates partly in series and in parallel. It shows a same number of outputs as inputs for the signal data while on top having an input used for the activation signal (control signal). Such signal can simply be derived from the clock activation signal of the registers. More sophisticated control circuitries can prevent frequent switching of the activation signal. One simple extension is obtained by the use of a counter to wait n-cycles before activation is actually switched off. Additional benefit can be achieved even in active state, if the transistors of the output stage are activated in such a way that short circuit current is minimized i.e. the PMOS and NMOS trees (single transistors in case of an inverter) are never active at the same time.

The invention claimed is:
1. A circuit comprising:
a first tri-state gate circuit, a second tri-state gate circuit, and a third tri-state gate circuit;
a first fence circuit and a second fence circuit;
a first input signal, a second input signal, an activate signal, and an output signal;
wherein the first, second, and third tri-state gate circuits each comprise:
a first stage, said first stage comprising a data input and a control input, wherein said first stage comprises an AND gate, an inverter, and an OR gate, the AND gate having a first input and a second input and an output, and the OR gate having a first input and a second input and an output, the inverter configured to output a signal into the second input of the OR gate;
a second stage, said second stage comprising a PMOS transistor and an NMOS transistor, wherein the output of the OR gate is configured to provide an input to the gate of the PMOS transistor, and wherein the output of the AND gate is configured to provide an input to the gate of the NMOS transistor, wherein the PMOS transistor is electrically connected to a positive voltage source, and wherein the NMOS transistor is electrically connected to ground, and wherein the PMOS transistor and NMOS transistor are configured in series thereby forming a junction between the PMOS transistor and the NMOS transistor, and a second stage output signal originates from the junction of the PMOS transistor and the NMOS transistor; and a third stage, said third stage comprising a dual input logic gate, the dual input logic gate having a first input and a second input, and a single third stage output signal; and wherein the first input signal is connected to the first tri-state gate circuit, the second input signal is connected to the second tri-state gate circuit; and wherein the output of the first tri-state gate circuit is connected to the first fence circuit, the second tri-state gate circuit, and the third tri-state gate circuit; and wherein the output of the second tri-state gate circuit is connected to the third tri-state gate circuit; and wherein the output of the third tri-state gate circuit is connected to the second fence circuit; and wherein the activate signal is connected to each tri-state gate circuit and each fence circuit.

2. The circuit of claim 1, wherein the first fence circuit and second fence circuit each comprise an OR gate having a first input and a second input and an output, and an inverter, wherein the inverter is configured to output a signal into the second input of the OR gate.

3. The circuit of claim 1, wherein the first fence circuit and second fence circuit each comprise an AND gate having a first input and a second input and an output, and a first inverter and a second inverter, wherein the first inverter is configured to output a signal into the second inverter, and wherein the second inverter is configured to output a signal into the second input of the AND gate.

4. The circuit of claim 1, wherein the first fence circuit comprises an AND gate having a first input and a second input and an output, and a first inverter and a second inverter, wherein the first inverter is configured to output a signal into the second inverter, and wherein the second inverter is configured to output a signal into the second input of the AND gate, and wherein the second fence circuit comprises an OR gate having a first input and a second input and an output, and an inverter, wherein the inverter is configured to output a signal into the second input of the OR gate.

* * * * *